United States Patent
Peuser

(10) Patent No.: US 9,091,710 B2
(45) Date of Patent: Jul. 28, 2015

(54) CIRCUIT ARRANGEMENT AND METHOD FOR MONITORING ELECTRICAL ISOLATION

(71) Applicant: Robert Bosch GmbH, Stuttgart (DE)

(72) Inventor: Thomas Peuser, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 133 days.

(21) Appl. No.: 13/835,350

(22) Filed: Mar. 15, 2013

(65) Prior Publication Data
US 2013/0257463 A1    Oct. 3, 2013

(30) Foreign Application Priority Data
Mar. 28, 2012 (DE) .......... 10 2012 204 990

(51) Int. Cl.
| | | |
|---|---|---|
| G01R 31/08 | (2006.01) | |
| G01R 27/02 | (2006.01) | |
| G01R 31/02 | (2006.01) | |
| G01R 27/16 | (2006.01) | |
| G01R 31/00 | (2006.01) | |

(52) U.S. Cl.
CPC .............. *G01R 27/02* (2013.01); *G01R 31/025* (2013.01); *G01R 27/16* (2013.01); *G01R 31/006* (2013.01)

(58) Field of Classification Search
CPC ................. G01R 31/025; G01R 27/02–27/025
USPC ....................................................... 324/522
See application file for complete search history.

(56) References Cited

U.S. PATENT DOCUMENTS

| | | | |
|---|---|---|---|
| 3,320,533 A * | 5/1967 | Watters .................... 324/123 R |
| 5,446,682 A * | 8/1995 | Janke et al. ..................... 702/85 |
| 6,615,146 B1 * | 9/2003 | Malik et al. ..................... 702/58 |
| 7,219,022 B2 * | 5/2007 | Wekhande ...................... 702/58 |
| 8,178,227 B1 * | 5/2012 | Hermann ........................ 429/92 |
| 2004/0212371 A1 * | 10/2004 | Nomoto et al. ................ 324/522 |
| 2006/0108875 A1 * | 5/2006 | Grundmann et al. .......... 307/70 |
| 2008/0290948 A1 * | 11/2008 | Fujii ............................. 330/295 |
| 2009/0244938 A1 * | 10/2009 | Gebert ............................ 363/55 |
| 2011/0084705 A1 * | 4/2011 | Kawamura .................... 324/551 |
| 2011/0181306 A1 * | 7/2011 | Nalbant ......................... 324/713 |
| 2011/0218745 A1 * | 9/2011 | Hasan et al. .................... 702/58 |
| 2011/0304339 A1 * | 12/2011 | Schumacher et al. ........ 324/509 |
| 2011/0307196 A1 * | 12/2011 | Schumacher ................... 702/58 |

* cited by examiner

*Primary Examiner* — Patrick Assouad
*Assistant Examiner* — Demetrius Pretlow
(74) *Attorney, Agent, or Firm* — Michael Best & Friedrich LLP

(57) ABSTRACT

A circuit arrangement (16) for monitoring electrical isolation in a power supply system (7). Electrical isolation is provided between a high-voltage system (8) and a low-voltage system (9), wherein the high-voltage system (8) and the low-voltage system (9) are connected to ground (14), and wherein the high-voltage system (8) has a first connection (T+) for a first supply voltage potential and a second connection (T−) for a second supply voltage potential of a voltage source (10). In each case, at least one variable resistor (Rm1, Rm2) is connected between the connections (T+, T−) and ground (14), and a voltage measuring device (17) for detecting a potential shift of the ground (14) relative to the supply voltage potentials when at least one of the resistors (Rm1, Rm2) is varied. And an evaluation device, which determines the ability of the electrical isolation to function depending on the detected potential shifts.

14 Claims, 4 Drawing Sheets

CIRCUIT ARRANGEMENT AND METHOD FOR MONITORING ELECTRICAL ISOLATION

BACKGROUND OF THE INVENTION

The invention relates to a circuit arrangement for monitoring electrical isolation in a power supply system, in particular a motor vehicle, which electrical isolation is provided between a high-voltage system and a low-voltage system of the power supply system, wherein the high-voltage system and the low-voltage system are connected to ground, and wherein the high-voltage system has a first connection for a first supply voltage potential and a second connection for a second supply voltage potential of a voltage source.

In addition, the invention relates to a method for monitoring electrical isolation in a power supply system as has been described above.

Circuit arrangements and methods for monitoring electrical isolation are known from the prior art. In particular in the case of modern motor vehicles which have a so-called hybrid drive apparatus, the on-board power supply system comprises at least two subsystems, a high-voltage system which is connected to a high-voltage source, which supplies energy to at least one electric machine or draws energy produced by the electric machine, and a low-voltage source for supplying the conventional part of the on-board power supply system, which supplies energy to loads, for example, such as interior lighting, a radio or a navigation system. Standards, regulations and functional requirements demand electrical isolation between the high-voltage system and the low-voltage system. This electrical isolation needs to be monitored in order to be able to ensure safe operation of the motor vehicle. For this monitoring, various methods are already known, but these methods have the disadvantage that only asymmetric cases are identified, i.e. when the isolation or electrical isolation with respect to the two voltage systems are impaired identically, this cannot be identified. Other methods are complex and involve high costs, and further methods cannot be used in the case of a clocking inverter, i.e. they can only be implemented before or after an operating cycle, but not during use of the power supply system.

Generally, both voltage systems are connected to ground or to a ground connection, wherein the high-voltage system is expediently connected to ground at a high resistance, and to in each case one of the energy stores. For this purpose, the high-voltage system has two connections, of which one is or can be connected to a first supply voltage potential, for example the positive terminal, and the second connection is or can be connected to a second supply voltage potential, for example to the negative terminal, of the voltage source.

SUMMARY OF THE INVENTION

The circuit arrangement according to the invention has the advantage over the known circuit arrangements that it is inexpensive and has a robust design and also that it enables the detection of a fault in the electrical isolation, in particular also so-called symmetrical faults, even during operation of the power supply system, or the motor vehicle. The circuit arrangement according to the invention is characterized by the fact that in each case at least one variable resistor is connected between the connections and ground, and by the fact that a voltage measuring device for detecting a potential shift of the ground relative to the supply voltage when at least one of the resistors is varied and an drive direction, which determines the ability of the electrical isolation to function depending on the detected potential shift, are provided. Therefore, in each case one variable resistor is connected between each of the connections of the high-voltage system and ground, which variable resistor or the resistance value thereof can be varied, as required. The voltage measuring device detects a relative potential shift between ground and the connections or the supply voltage potentials present in each case at the connections in the form of voltages, in particular output voltages, when at least one of the resistors is varied. By virtue of the resistors being varied, a potential shift to be expected results when the electrical isolation is functioning properly. An evaluation device which is preferably provided determines whether the electrical isolation is functioning properly depending on the detected potential shift, in particular by a comparison with a potential shift to be expected. If the detected potential shift deviates from the potential shift to be expected or deviates from this to too great an extent, a fault in the electrical isolation is diagnosed by the evaluation device. If appropriate, the evaluation device then introduces countermeasures or safety measures, such as disconnection of the system, for example. In order to achieve a meaningful result, the voltage present between the connections of the high-voltage system needs to be assumed to be known. Since the bias voltage system is generally connected to a corresponding energy source, the voltage can either be predicted or detected using simple measurement means.

Preferably, the variable resistors are each in the form of measuring resistors with a fixedly predetermined resistance value and an associated actuable switch for connecting or isolating the respective measuring resistor. Instead of providing expensive measuring resistors with a variable resistance value, the invention merely provides for the connection or isolation of the measuring resistors, as a result of which a particularly simple and inexpensive possibility for varying a resistance and for detecting the potential shifts is provided.

Particularly preferably, the respective measuring resistor has a high resistance value. Provision is particularly made for the respective measuring resistor to have a resistance value of 5 Mohm.

In accordance with a preferred development of the invention, provision is made for the voltage measuring device to have a voltage divider between one of the connections and ground. By virtue of the voltage divider, an output voltage or potential shift can be brought within a range which can be measured using inexpensive component parts.

Preferably, in addition the voltage measuring device has an amplifier, in particular in the form of an impedance transformer or electrometer amplifier. The amplifier is preferably connected between the measurement point and the tap for the measurement, with the result that the circuit properties of the circuit arrangement are barely influenced by the measurement.

In order to monitor the electrical isolation, at least one of the resistors is varied and the potential shift resulting therefrom of the ground relative to the supply potentials is detected, wherein the ability of the electrical isolation to function is determined depending on the detected potential shift. In particular, in this case the detected potential shift is compared with a predeterminable reference potential shift. If the detected potential shift deviates from the reference potential shift or deviates from this to too great an extent, a fault in the electrical isolation is diagnosed. Preferably, the reference potential shift is predetermined by a range within which a deviation is still tolerated without a fault message being output.

In accordance with an advantageous development of the invention, provision is made for first one of the resistors and then another of the resistors to be varied and, in the process, in each case one potential shift resulting therefrom to be detected. Expediently, as described above, the potential shift is detected by means of a voltage measuring device, which has a voltage divider between one of the connections and ground and preferably comprises an amplifier. Preferably, the resistors, as described above, are in the form of measuring resistors with a fixed resistance value, wherein in each case one switch for connection or isolation is associated with said resistors. The resistors are thus varied by actuating the respective switch.

The respective potential shift is preferably detected as a voltage by means of the voltage measuring device.

Furthermore, provision is made for preferably a differential voltage to be formed from the detected voltages, and this differential voltage is compared with a predeterminable reference value or a reference differential voltage. To this extent, in this case a comparison of the detected potential shift with a reference potential shift takes place. If the detected differential voltage deviates from the predetermined reference differential voltage, it is correspondingly concluded that there is a fault in the electrical isolation and a fault message is output, for example.

Preferably, the monitoring of the electrical isolation is repeated continuously, in particular also during operation of the power supply system of the motor vehicle, in particular hybrid motor vehicle, with the result that continuous checking of the electrical isolation takes place.

BRIEF DESCRIPTION OF THE DRAWINGS

The invention will be explained in more detail below with reference to the drawings, in which.

DETAILED DESCRIPTION

Figure 1:
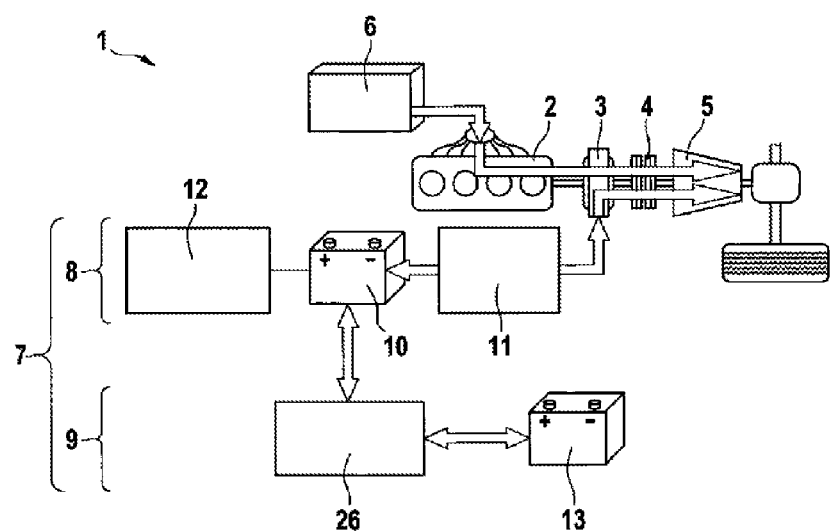
FIG. 1 shows a typical drive system for a hybrid vehicle.

FIG. 1 shows a simplified illustration of a hybrid drive apparatus 1 of a motor vehicle (only indicated here). The hybrid drive apparatus 1 has a conventional internal combustion engine 2, the output shaft of which is connected to an electric machine 3. The electric machine 3 can in turn be operatively connected via an actuable clutch 4 to a transmission 5, the output shaft of which is connected to driving wheels of the motor vehicle.

While the internal combustion engine 2 is supplied with fuel from a fuel tank 6, the electric machine 3 is connected to a power supply system 7 of the vehicle. The power supply system 7 is divided into a high-voltage system 8 and a low-voltage system 9. In this case, the high-voltage system 8 is connected to the electric machine 3 and has an electrical energy store 10, which is connected to the electric machine 3 via an inverter 11. In this case, an energy management system 12 is associated with the energy store 10, said energy management system 12 detecting, for example, the state of charge of the energy store 10 and permitting or predetermining operation in the generator or motor mode of the electric machine 3 depending on the state of charge, for example.

The low-voltage system 9 likewise comprises an electrical energy store 13, which is designed for a comparatively lower voltage, in particular for a conventional on-board power supply system voltage of 12V. The energy store 13 is connected to the high-voltage system 8 via a DC-to-DC voltage converter 26.

In order to be able to ensure safe operation of the hybrid drive apparatus 1, it is necessary to isolate the potentials of the high-voltage system 8 and the low-voltage system 9 from one another.

Figure 2:
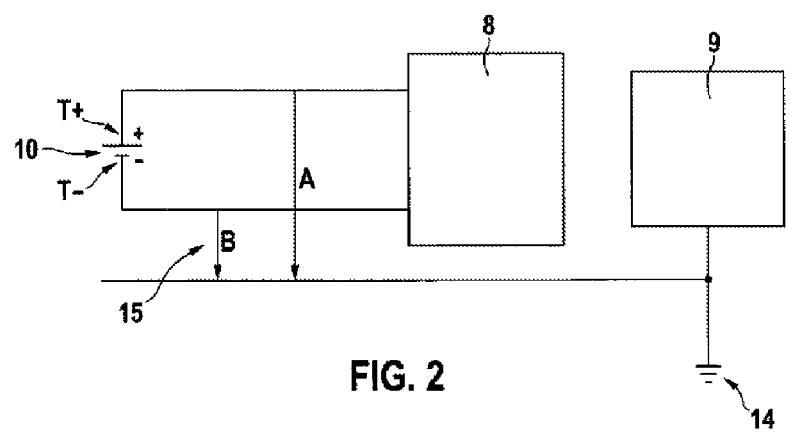
FIG. 2 shows a block circuit diagram of a power supply system for the hybrid vehicle.

FIG. 2 shows a typical block circuit diagram of such a power supply system 7, wherein the energy store 10 of the high-voltage system 8 is illustrated on the left, with the high-voltage system 8 being connected at a first connection T+ to the positive terminal of the energy store 10 and at a second connection T− to the negative terminal of the energy store 10, with the result that different supply potentials of the energy store 10 are present at the connections T+ and T−. The voltage between the connections T+ and T− is a few 100 V, in the present exemplary embodiment. Typically, when using modern semiconductors, the voltage can be up to 450 V, up to 1500 V when only current standards are taken into consideration, and in principle the voltage can be as high as desired. To the right of this, the high-voltage system 8 itself is indicated. Next to this, the low-voltage system 9 is illustrated as a further block, which is connected to ground 14. The low-voltage system 9 and the high-voltage system 8 are electrically coupled via electrical isolation 15 or beyond the electrical isolation 15, wherein the connecting paths A and B are designed to have a high resistance, in accordance with standards and the intended use, in order to ensure electrical isolation. It is typical here for the potential of the ground of the low-voltage system 9 to be approximately in the center between T+ and T−.

In order to always ensure safe operation of the hybrid drive apparatus 1, the electrical isolation 15 needs to be monitored. For this purpose, provision is made for potential shifts to be measured by actively varying resistances and for the measured variations to be compared with an expected value, wherein the comparison gives information on the status of the insulation resistance or the electrical isolation 15.

Figure 3:
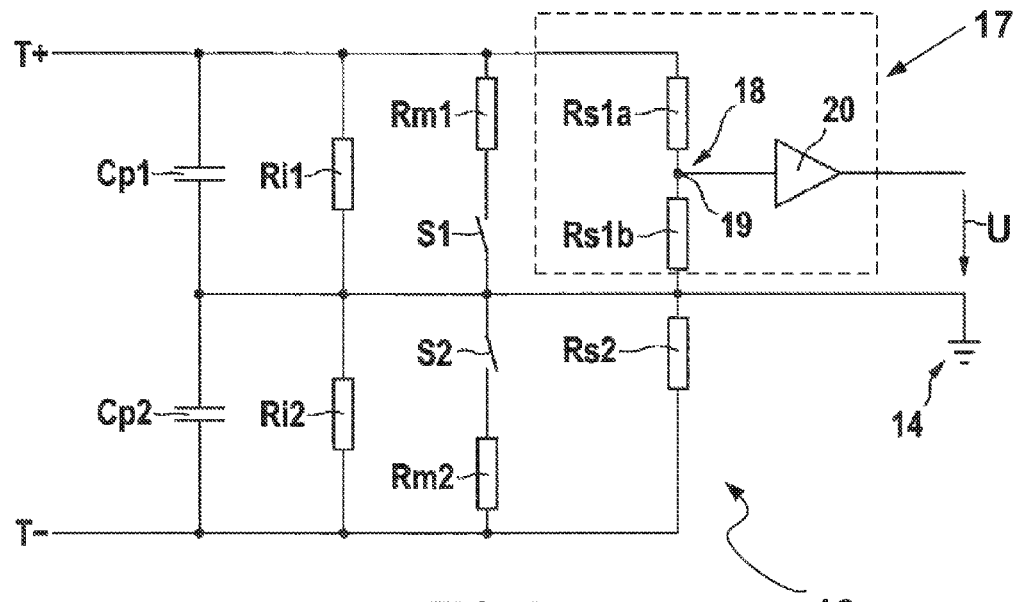
FIG. 3 shows a circuit arrangement for monitoring the electrical isolation.

In this regard, FIG. 3 shows a circuit arrangement 16, which is used for potential monitoring. The circuit arrangement 16 first has the connections T+ and T− of the high-voltage system 8. The connections T+ and T− are connected via in each case one capacitance Cp1 and Cp2 to ground 14. In each case one resistance Ri1 and Ri2 is connected in parallel with the capacitances, said resistances representing the insulation resistances to be monitored or the electrical isolation 15 and in this regard not being physically present as a component part. The capacitances Cp1 and Cp2 are parallel capacitances, formed either as a parasitic element or as an exclusive component part, such as a Y capacitor, for example. It is assumed that the voltage between T+ and T− is known; this can be achieved by means of the energy management system 12, for example.

Furthermore, balancing resistors Rs1$a$, Rs1$b$ and Rs2 are provided, but these can theoretically also be dispensed with. The balancing resistors Rs1$a$, Rs1$b$ and Rs2 preferably have a high resistance value, typically a value of a few Mohms, for example 5 Mohm.

Furthermore, measuring resistors Rm1 and Rm2 are connected in parallel with the internal resistances Ri1 and Ri2 and the capacitances Cp1 and Cp2, with in each case one switch S1 or S2 being associated with said measuring resistors. By actuating the respective switch S1 or S2, the measuring resistors Rm1 or Rm2 can be connected or isolated. In this regard, by actuating the switches S1 and S2, the resistance in the respective branch can be varied correspondingly.

Furthermore, the circuit arrangement 16 has a voltage measuring device 17, which has a voltage divider 18, wherein a measurement point 19 is positioned between the balancing resistors Rs1a and Rs1b. As a result, the voltage divider 18 is located between the connection T+ and ground 14, with the result that a voltage that can be measured at the voltage divider 18 is brought within a range which can be measured using inexpensive component parts. The voltage measuring device 16 detects the voltage U between the tap of the voltage divider 17 and ground 14. Depending on the measured voltage U, a potential shift of the connections T+ and T− relative to ground 14 is detected.

In order to influence the circuit properties of the circuit arrangement 16 as little as possible owing to a measurement, an amplifier 20 is connected between the measurement point 19 and the tap for the measurement. The amplifier 20 is in particular in the form of an impedance transformer or an electrometer amplifier.

The operation is as follows: when both switches S1 and S2 are open, the potentials are set in the case of symmetrical resistances Ri1 and Ri2 such that ground 14 is approximately in the center between T+ and T−. This is likewise the case with symmetrical insulation faults.

In order to monitor the electrical isolation, first the switch S1 is closed and the other switch S2 is opened. As a result, the potential or supply voltage potential drifts from T+ in the direction of ground 14. Once the system has settled, a voltage U1 can be measured with the aid of the amplifier 20.

Then, the switch S1 is opened and the switch S2 is closed. As a result, the potential drifts from T− in the direction of ground 14. In this case, once the system has settled, a resultant voltage U2 is likewise measured using the amplifier 20.

The respective variation owing to the connection of the measuring resistors Rm1 and Rm2 is greater the greater the value of the other resistances in the system.

With the aid of the difference between U1 and U2, it is possible to establish in a very simple manner whether the insulation resistance has left a defined permissible range or whether the electrical isolation is functioning without any problems. If, for example, the difference between U1 and U2 falls below a previously defined limit value, an insulation fault is present and a corresponding system response needs to be introduced. For this purpose, for example, an evaluation device (not illustrated in any more detail here) is provided, said evaluation device comparing the voltage signal U1 or U2 output by the voltage measuring device with the predeterminable limit value and introducing shutdown of the system or the like when an insulation fault is established.

The previously described operation is repeated continuously in order to enable permanent monitoring even during operation. The cycle time for the measurement is preferably dependent on the resistance value of the resistors used. Furthermore, the capacitances Cp1 and Cp2 are optionally also included as parasitic components in the circuit or as an explicit component part. For example, times in the seconds range are used; by way of example a time constant of approximately 1 second results in the case of a resistor with a value of 5 Mohm and with Y capacitors with a capacitance of 220 nF. However, measurement cycles are also conceivable which last considerably longer or shorter, depending on the requirement for and dimensioning of the circuit arrangement and/or the power supply system 7.

For a measurement which is reliable during operation, preferably one or more filters are also introduced.

Figure 4:
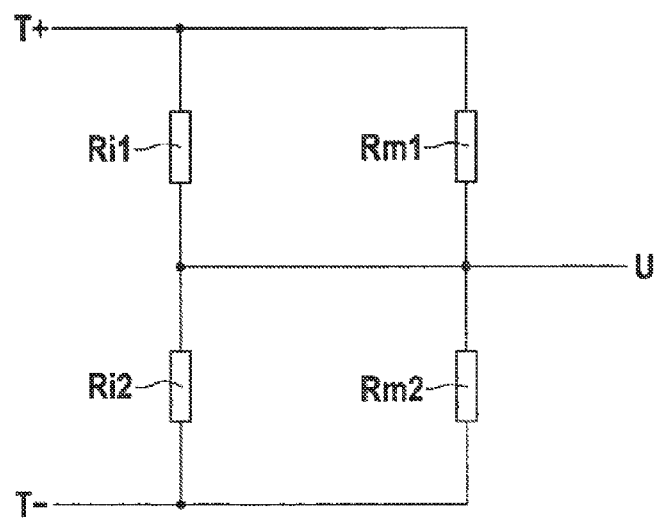
FIG. 4 shows the simplified circuit arrangement for a first estimation.

FIG. 4 shows the circuit arrangement 16 in a simplified illustration, which is used for estimating measured values to be expected and which leads to the results shown in FIGS. 5 to 8. The following is assumed here: the measuring resistors Rm1 and Rm2 each have a resistance value of 5 Mohm. All of the other resistances are assumed to have nominal values of likewise 5 Mohm.

The present FIGS. 5 to 8 illustrate graphs with a Y axis which has a T-standardized voltage U in the settled state. In this case, various resistance combinations are plotted on the X axis. If not otherwise mentioned, the varied resistance is greater towards the left, has its nominal value at X=0, is still just within the standard at X=15 for a 400V system and is just outside the standard for X=16. The curve 21 shows the case for isolated measuring resistor Rm1 and isolated measuring resistor Rm2. The curve 22 shows the voltage U with the measuring resistor Rm1 switched on and the measuring resistor Rm2 switched off, i.e. when the switch S1 is closed and the switch S2 is open. The curve 23 shows the voltage for the case in which the measuring resistor Rm1 is isolated and the measuring resistor Rm2 is connected. The curve 25 shows the difference to be evaluated between U1 and U2. In contrast to the above description, the voltage after T− is illustrated. The underlying information or the underlying method do not change as a result, however.

Figure 5:
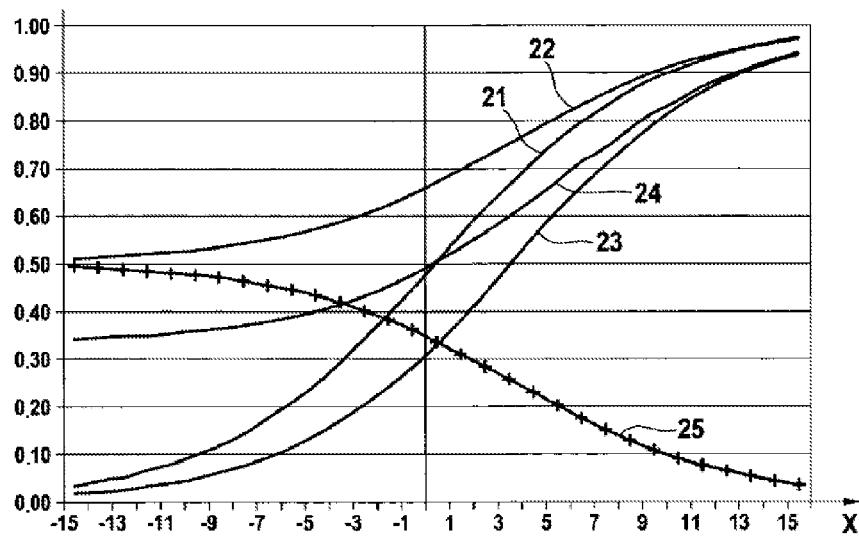
FIGS. 5 to 8 show exemplary results of monitoring.

FIG. 5 shows the result of the circuit arrangement shown in FIG. 4 with a drift of the internal resistance Ri1 when Ri1 is variable and Ri2 is constant. At nominal resistances, the measurement result is ⅓ T. Excessively low resistances are very clearly detectable. When the standard limit is departed from, the value is clearly below 0.1 T, i.e. by more than a factor of 3 below the original value. These values can differ markedly in the case of real implementation, but are a good indication of the robustness of the proposed method.

Figure 6:
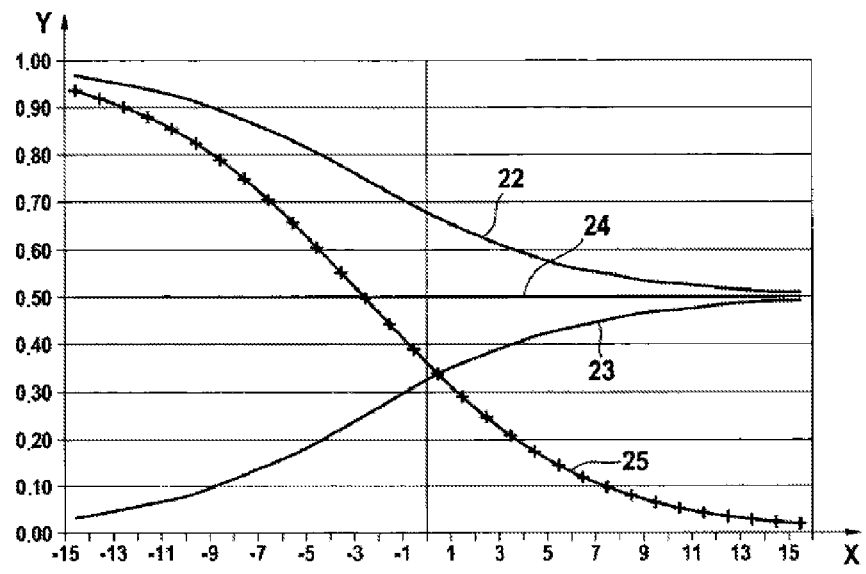

FIG. 6 shows the circuit arrangement given a symmetrical fault when the resistances Ri1 and Ri2 are variable. This represents a fault which was previously very difficult to detect. Both insulation resistances (Ri1 and Ri2) drift in the same direction. The result is the same as above: the nominal value results in a measured value of ⅓ T, and the excessively low resistances can be detected very clearly.

Figure 7:
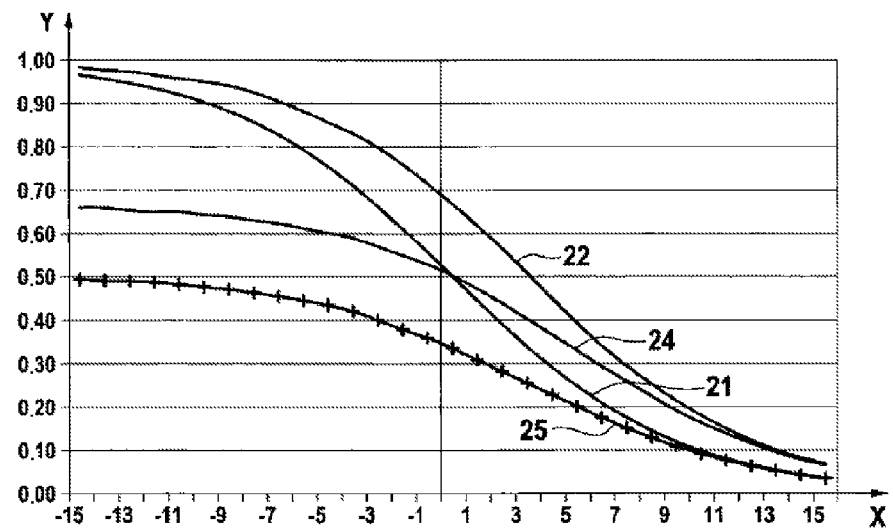

FIG. 7 shows the reverse fault to that in the calculation shown in FIG. 5. Nevertheless, the result is principally the same. When the resistance Ri1 is constant and the resistance Ri2 is varied or variable, the nominal value results in a measured value of ⅓ T, and the low resistances are very clearly detectable.

Figure 8:
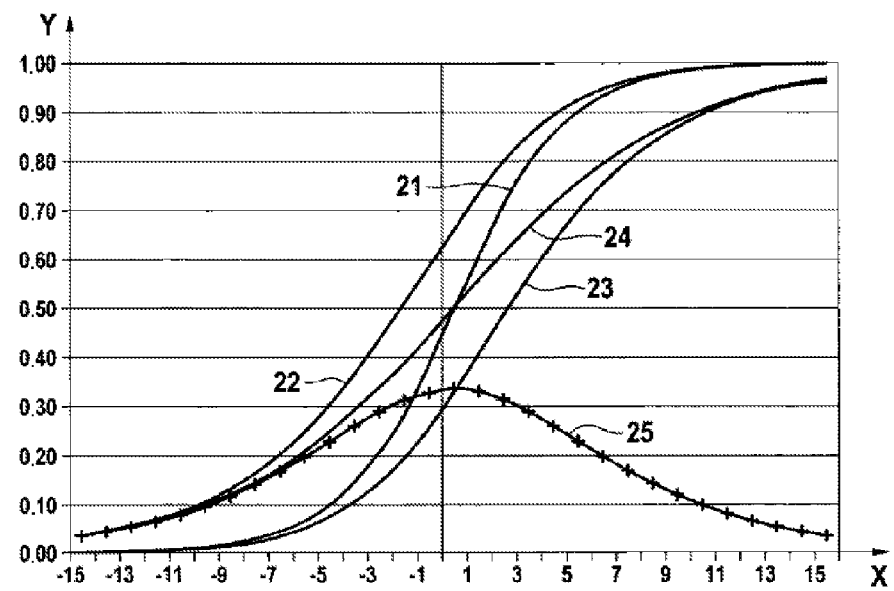

FIG. 8 shows the case in which the resistances Ri1 and Ri2 are variable, but in opposition. The calculation with oppositely varying parameters also shows a very similar response, since in this case in each case one resistance Ri1 or Ri2 becomes too low in both directions, and therefore the insulation input is impaired in both directions. Therefore, it is also true here that, given nominal values, ⅓ T is measured, and given an excessively low measured value, the insulation input is impaired.

As can easily been seen, a relatively large margin is provided for the design, which makes the proposed solution very simple, inexpensive and robust.

The switches S1 and S2 are likewise very favorable up to approximately 400V as a mechanically small mass-produced component part. For higher voltages, either suitable component parts would possibly need to be developed or the dielectric strength would need to be increased by virtue of an appropriate series connection. Owing to the series resistors with high resistance values, even a direct series connection may be possible.

The invention claimed is:

1. A circuit arrangement (16) for monitoring electrical isolation in a power supply system (7) which electrical isolation is provided between a high-voltage system (8) and a low-voltage system (9) of the power supply system (7), wherein the high-voltage system (8) and the low-voltage system (9) are connected to ground (14), and wherein the high-voltage system (8) has a first connection (T+) for a first supply voltage potential and a second connection (T−) for a second supply voltage potential of a voltage source (10), the circuit arrangement (16) comprising: at least one variable resistor (Rm1, Rm2) connected between the connections (T+, T−) and ground (14), a voltage measuring device (17) for detecting a potential shift of the ground (14) relative to the supply voltage potentials when at least one of the resistors (Rm1, Rm2) is varied and an evaluation device, which determines the ability of the electrical isolation to function depending on the detected potential shifts.

2. The circuit arrangement according to claim 1, wherein the power supply system (7) is in a motor vehicle.

3. The circuit arrangement according to claim 1, characterized in that the variable resistors (Rm1, Rm2) are each in the form of measuring resistors with a fixedly predetermined value and an associated actuable switch (S1, S2) for connecting or isolating the respective measuring resistor (Rm1, Rm2).

4. The circuit arrangement according to claim 1, characterized in that the measuring resistor (Rm1, Rm2) has a high resistance value.

5. The circuit arrangement according to claim 1, characterized in that the voltage measuring device (17) has a voltage divider (18) between one of the connections (T+, T−) and ground (14).

6. The circuit arrangement according to claim 1, characterized in that the voltage measuring device (16) has an amplifier (20).

7. The circuit arrangement according to claim 6, wherein the amplifier is an impedance transformer.

8. The circuit arrangement according to claim 6, wherein the amplifier is an electrometer amplifier.

9. A method for monitoring electrical isolation in a power supply system (7) which electrical isolation is provided between a high-voltage system (8) and a low-voltage system (9) of the power supply system (7), wherein the high-voltage system (8) and the low-voltage system (9) are connected to ground (14), and wherein the high-voltage system (8) has a first connection (T+) for a first supply voltage potential and a second connection (T−) for a second supply voltage potential of a voltage source, characterized in that in each case at least one variable resistor is connected between the connections (T+, T−) and ground (14), and in that at least one of the resistors is varied and a potential shift resulting therefrom of the ground (14) relative to the supply voltage potentials is detected, wherein the ability of the potential isolation to function is determined depending on the potential shift.

10. The method according to claim 9, wherein the power supply system (7) is in a motor vehicle.

11. The method according to claim 9, characterized in that first one of the resistors (Rm1, Rm2) and then another of the resistors (Rm2, Rm1) is varied and, in the process, in each case the potential shift resulting therefrom is detected.

12. The method according to one claim 9, characterized in that the potential shift is detected as a voltage (U).

13. The method according to claim 9, characterized in that a difference is formed from the detected voltages (U1, U2), and this difference is compared with a predeterminable reference value.

14. The method according to claim 9, characterized in that monitoring is repeated continuously.

\* \* \* \* \*